United States Patent
Jung

(10) Patent No.: US 12,369,411 B2
(45) Date of Patent: Jul. 22, 2025

(54) INDIRECT TIME-OF-FLIGHT (ToF) PIXEL STRUCTURE

(71) Applicant: DB HiTek Co., Ltd., Bucheon-si (KR)

(72) Inventor: Ju Hwan Jung, Seoul (KR)

(73) Assignee: DB HiTek Co., Ltd., Bucheon-si (KR)

( * ) Notice: Subject to any disclaimer, the term of this patent is extended or adjusted under 35 U.S.C. 154(b) by 683 days.

(21) Appl. No.: 17/736,828

(22) Filed: May 4, 2022

(65) Prior Publication Data

US 2022/0367532 A1 Nov. 17, 2022

(30) Foreign Application Priority Data

May 12, 2021 (KR) .......................... 10-2021-0061300

(51) Int. Cl.
H10F 39/10 (2025.01)

(52) U.S. Cl.
CPC .................................. H10F 39/103 (2025.01)

(58) Field of Classification Search
CPC .......... H01L 27/1443; H01L 27/14603; H04N 25/59; H04N 25/616; H10F 39/103; H10F 39/802; H10F 39/803; H10F 10/169; H10D 62/117
See application file for complete search history.

(56) References Cited

U.S. PATENT DOCUMENTS

| | | | |
|---|---|---|---|
| 9,225,922 B2 | 12/2015 | Lee et al. | |
| 10,389,957 B2 * | 8/2019 | Bamji | G01S 7/481 |
| 11,265,498 B2 | 3/2022 | Jin et al. | |
| 2008/0083940 A1* | 4/2008 | Ezaki | H10F 39/18 257/292 |
| 2009/0284731 A1* | 11/2009 | Jin | H04N 25/705 356/4.01 |
| 2011/0233707 A1* | 9/2011 | Fukuro | H10F 39/8037 257/E31.127 |
| 2011/0248371 A1* | 10/2011 | Matsumura | H10F 39/80373 257/443 |
| 2013/0020463 A1 | 1/2013 | Lee et al. | |
| 2014/0117428 A1 | 5/2014 | Lee et al. | |
| 2017/0038471 A1* | 2/2017 | Ikeda | H10F 55/255 |
| 2017/0287958 A1* | 10/2017 | Ohri | H10F 39/199 |
| 2019/0014278 A1* | 1/2019 | Kumagai | H10F 39/802 |
| 2020/0029047 A1 | 1/2020 | Jin et al. | |
| 2020/0203416 A1* | 6/2020 | Jin | H10F 39/8037 |

FOREIGN PATENT DOCUMENTS

| | | |
|---|---|---|
| KR | 10-2009-0118795 A | 11/2009 |
| KR | 10-2013-0011218 A | 1/2013 |
| KR | 10-1352436 B1 | 1/2014 |
| KR | 10-2017-0102714 A | 9/2017 |
| KR | 10-2020-0009643 A | 1/2020 |

* cited by examiner

*Primary Examiner* — Ida M Soward
(74) *Attorney, Agent, or Firm* — Central California IP Group, P.C.; Andrew D. Fortney

(57) ABSTRACT

Proposed is an indirect Time-of-Flight (ToF) structure. In the indirect ToF structure, an electric charge storage portion in which electric charge is temporarily stored is provided between a photoelectric conversion portion and a floating diffusion portion, thereby making it possible to perform Correlated Double Sampling (CDS) and to remove noise during readout after an integration time.

14 Claims, 5 Drawing Sheets

INDIRECT TIME-OF-FLIGHT (ToF) PIXEL STRUCTURE

CROSS REFERENCE TO RELATED APPLICATION(S)

The present application claims priority to Korean Patent Application No. 10-2021-0061300, filed May 12, 2021, the entire contents of which are incorporated herein for all purposes by this reference.

TECHNICAL FIELD

The present disclosure relates to an indirect Time-of-Flight (ToF) pixel structure. More particularly, the present disclosure relates to a pixel structure including an electric charge storage portion configured to temporarily store electric charge between a photoelectric conversion portion (e.g., of the pixel structure) and a floating diffusion portion (e.g., of the pixel structure), thereby making it possible to perform Correlated Double Sampling (CDS) and to remove noise during readout after an integration time.

BACKGROUND ART

There has been a trend toward increasing research on a 3D camera, a motion capture sensor, and laser radar that are capable of obtaining information on the distance to an object. Particularly, with the development of and the increasing demand for 3D display devices capable of displaying a three-dimensional image, the importance of 3D content has gained attention. Accordingly, research has been actively conducted on various three-dimensional image acquisition apparatuses with which a general user can produce 3D content by himself/herself.

In recent years, the Time-of-Flight (ToF) technique has been applied to three-dimensional image acquisition apparatuses. The ToF technique is an approach for measuring the time it takes for light emitted to an object to travel to a light receiving unit after being reflected from the object. The ToF technique is as follows. Light with a near-infrared ray wavelength band of, for example, 800 to 950 nm is emitted to an object using an illumination optical system including a light-emitting diode (LED) or a laser diode, and the near-infrared light is reflected from the object and received in the light receiving unit. Then, a sequence of process steps for extracting depth information, such as demodulating the light received through a light shutter, are performed.

FIG. 1 is a cross-sectional view illustrating a ToF pixel structure in the related art.

The ToF pixel structure in the related art and a problem therewith will be described below with reference to the accompanying drawings.

With reference to FIG. 1, in the ToF pixel structure 9 in the related art, light with a specific wavelength is emitted to an object. Electric charge is generated in a photoelectric conversion portion 910 due to the light returning after being reflected from the object, and is transferred by a transfer gate 930 to a floating diffusion portion 950. Then, the amount of electric charge in the individual floating diffusion portion 950 is converted into a voltage after an integration time. The resulting voltage is compared with a value of a voltage of the floating diffusion portion 950 on a per-individual tap basis, and thus a distance to the object is derived.

In a specific operating process, before integration starts, the floating diffusion portion 950 on a per-individual tap basis is reset, and the reset level is extracted as a voltage. After the integration is finished, a voltage level of the individual floating diffusion portion 950 that is changed by the transferred electric charge is read out, and thus an amount of electric charge is derived through each voltage difference. In this sequence of processes, it is difficult to remove noise that occurs over time due to the floating diffusion portion 950 itself while the integration is in progress.

In order to solve this problem, a novel indirect ToF pixel structure with an improved structure has been created.

The foregoing is intended merely to aid in the understanding of the background of the present disclosure, and is not intended to mean that the present disclosure falls within the purview of the related art that is already known to those skilled in the art.

Documents of Related Art

Korean Patent Application Publication No. 10-2017-0102714, entitled "3D TIME OF FLIGHT DEPTH SENSORS AND METHOD OF MANUFACTURING THE SAME"

SUMMARY OF THE INVENTION

An objective of the present disclosure is to provide an indirect ToF pixel structure including an electric charge storage portion configured to temporarily store electric charge between a photoelectric conversion portion and a floating diffusion portion, thereby removing noise due to the floating diffusion portion for an integration time and thus making accurate readout possible.

Another objective of the present disclosure is to provide an indirect ToF pixel structure including a separate transfer gate between the electric charge storage portion and the floating diffusion portion, thereby transferring electric charge temporarily stored in the electric charge storage portion to the floating diffusion portion after integration.

Still another objective of the present disclosure is to provide an indirect ToF pixel structure having an electric charge storage portion with a dopant density and/or a pinning voltage higher than that/those of a corresponding photoelectric conversion portion, thereby facilitating the movement of electric charge from the photoelectric conversion portion to the electric charge storage portion.

Technical Solution

In order to achieve the above-mentioned objectives, embodiments of the present disclosure can be configured as follows for being practiced.

According to an aspect of the present disclosure, there is provided an indirect ToF cell structure including at least one tap comprising a photoelectric conversion portion in a substrate, the photoelectric conversion portion being configured to generate electric charge from incident light (e.g., after being reflected from an object), an electric charge storage portion in the substrate configured to store the electric charge from the photoelectric conversion portion, a first transfer gate on the substrate, the first transfer gate being between the photoelectric conversion portion and the electric charge storage portion, and a floating diffusion portion in the substrate, the floating diffusion portion being configured to receive the electric charge from the electric charge storage portion.

In the indirect ToF cell structure, the photoelectric conversion portion, the first transfer gate, the electric charge storage portion, and the floating diffusion portion may be sequentially arranged along a substantially straight and/or linear direction (e.g., within the tap).

In the indirect ToF cell structure, the tap may further include a second transfer gate on the substrate, between the electric charge storage portion and the floating diffusion region.

In the indirect ToF cell structure, the tap comprises at least two taps, and the at least two taps may share the photoelectric conversion portion.

In the indirect ToF cell structure that comprises at least two taps, the at least two taps may be symmetrical with respect to the photoelectric conversion portion.

According to another aspect of the present disclosure, there is provided an indirect ToF cell structure including a photoelectric conversion portion in a substrate, the photoelectric conversion portion being configured to generate electric charge from incident light (e.g., after being reflected from an object); an electric charge storage portion in the substrate configured to store the electric charge from the photoelectric conversion portion; a first transfer gate on the substrate, the first transfer gate being between the photoelectric conversion portion and the electric charge storage portion; a floating diffusion portion in the substrate, the floating diffusion portion being configured to receive the electric charge from the electric charge storage portion; and a second transfer gate on the substrate, between the electric charge storage portion and the floating diffusion portion, wherein the photoelectric conversion portion includes a first diffusion region having a second conductivity type in the substrate; and a second diffusion region having a first conductivity type on the first diffusion region.

In the indirect ToF cell structure, the electric charge storage portion may include a third diffusion region having the second conductivity type in the substrate; and a fourth diffusion region having the first conductivity type on the third diffusion region.

In the indirect ToF cell structure, the second diffusion region may contain or comprise a higher density of dopant (e.g., a dopant element) than a first portion of the substrate under the second diffusion region, and the fourth diffusion region may contain or comprise a higher density of the same or a different dopant (e.g., the dopant element or a different dopant element) than a second portion of the substrate under the fourth diffusion region.

In the indirect ToF cell structure, the electric charge storage portion may have a pinning voltage higher than that of the photoelectric conversion portion. In other words, the electric charge storage portion may have a first pinning voltage, the photoelectric conversion portion may have a second pinning voltage, and the first pinning voltage may be greater than the second pinning voltage.

In the indirect ToF cell structure, the third diffusion region may contain a higher density of impurities than the first diffusion region.

In the indirect ToF cell structure, the electric charge storage portion may receive the electric charge from the photoelectric conversion portion and may store the electric charge during integration, and the floating diffusion portion receives the electric charge from the electric charge storage portion after the integration.

The indirect ToF cell structure may be configured to reset the floating diffusion portion and then transfer the electric charge from the electric charge storage portion to the floating diffusion portion after the integration.

According to still another aspect of the present disclosure, there is provided an indirect ToF cell structure including a photoelectric conversion portion in a substrate; a plurality of first transfer gates on the substrate; a plurality of electric charge storage portions in the substrate, wherein each of first transfer gates is between the photoelectric conversion portion and a corresponding one of the electric charge storage portions, and each of the electric charge storage portions has (i) a first side adjacent to a corresponding one of the plurality of first transfer gates; a plurality of second transfer gates on the substrate, wherein each of the plurality of second transfer gates is adjacent to the second side of a corresponding one of the plurality of electric charge storage portions; and a plurality of the floating diffusion portions in the substrate, wherein each of the second transfer gates is between the corresponding one of the plurality of electric charge storage portions and a corresponding one of the floating diffusion portions, wherein the first transfer gates, the electric charge storage portions, the second transfer gates, and the floating diffusion portions are in rows that are symmetrical with respect to the photoelectric conversion portion.

The indirect ToF cell structure may be part of a 2-tap pixel structure or a 4-tap pixel structure.

Advantageous Effects

The present disclosure provides the following advantageous effects.

According to the present disclosure, the electric charge storage portion is between the photoelectric conversion portion and the floating diffusion portion. Thus, the advantageous effect of removing noise due to the floating diffusion portion for an integration time and improving the accuracy of the ToF cell can be achieved.

In addition, according to the present disclosure, a separate transfer gate is between the electric charge storage portion and the floating diffusion portion. Thus, the advantageous effect of transferring the electric charge temporarily from the electric charge storage portion after integration can be achieved.

In addition, according to the present disclosure, the electric charge storage portion has a doping or dopant density that enables the pinning voltage of the electric charge storage portion to be higher than the pinning voltage of the photoelectric conversion portion. Thus, the advantageous effect of facilitating movement of the electric charge from the photoelectric conversion portion to the electric charge storage portion can be achieved.

It is noted that, although not explicitly described under this section, advantageous effects and tentative advantageous effects that are expected from technical features of the present disclosure may be regarded as being described in the specification of the present disclosure.

BRIEF DESCRIPTION OF DRAWINGS

The above and other objectives, features, and other advantages of the present disclosure will be more clearly understood from the following detailed description when taken in conjunction with the accompanying drawings, in which.

DETAILED DESCRIPTION

Embodiments of the present disclosure will be described in more detail below with reference to the accompanying drawings. Various modifications may be made to the present disclosure. The scope of the present disclosure should not be construed as being limited to the following embodiments, and should be defined in the claims. In addition, the present disclosure is referentially provided in order to enable a person of ordinary skill in the art to get a full understanding of the present invention.

Unless otherwise mentioned in context, a singular noun or a singular noun phrase may have a plural meaning through the present specification. The term "comprising" in the present specification is intended to indicate that a shape, a number, a step, an operation, a member, a constituent element, and/or a group thereof are present, and therefore should be understood not to preclude the presence or addition of one or more other shapes, numbers, steps, operations, members, constituent elements, and/or groups thereof.

It should be noted that, when one constituent element (layer) is described as being on another constituent element (layer), this means that the one constituent element may be directly on the other constituent element or that one or more third constituent elements or layers may be therebetween. In addition, when one constituent element is described as being directly on the other constituent element, a third constituent element is not therebetween. In addition, positioning on a "top", "upper portion", or "lower portion" of one constituent element, positioning "above" or "below" one constituent element, or positioning on a "lateral side" or a "lateral surface" of one constituent element means a relative positional relationship.

In addition, the terms first, second, third, and so on may be used in order to describe various items, such as elements, regions, and/or portions, but do not impose any limitation to these items.

In addition, for convenience of description, regions (e.g., doping regions) of constituent elements having a conductivity type may be categorized into P-type or N-type regions according to primary carrier characteristics. The technical idea of the present disclosure is not limited to the one described for illustrative purpose. For example, the terms "P-type" and "N-type" may be represented more generically herein as a "first conductivity type" and a "second conductivity type.". The first conductivity type and the second type may refer to P-type and N-type, respectively.

In addition, the terms "high density" and "low density" may indicate a doping density of an impurity region, and should be understood as relative doping densities of one or more constituent dopant elements.

In the present specification, according to need, individual constituent elements may be integral with each other or independent of each other. It should be noted that no specific limitation to these formations is imposed.

Figure 1:
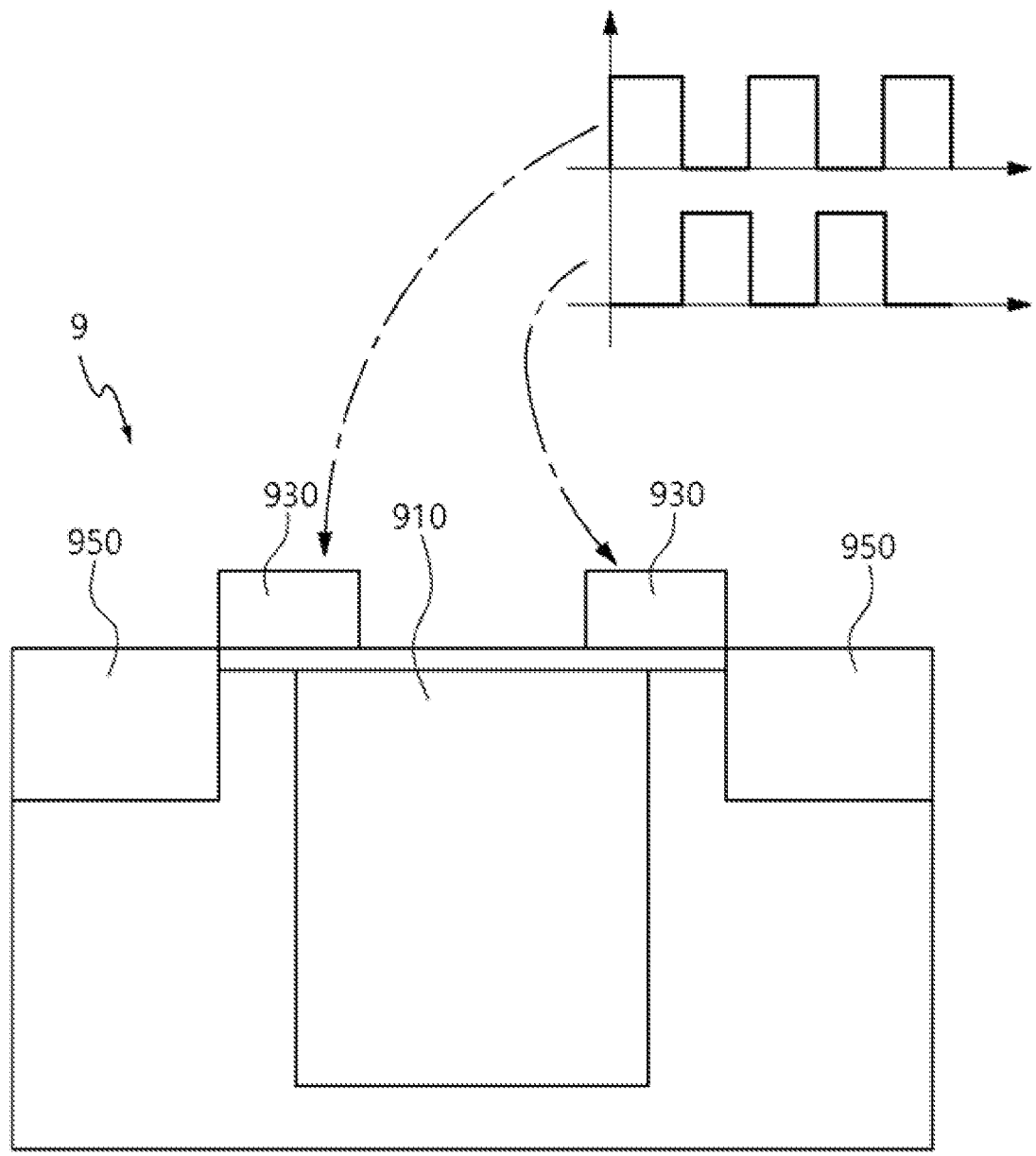
FIG. 1 is a cross-sectional view illustrating a ToF pixel structure in the related art.
Figure 2:
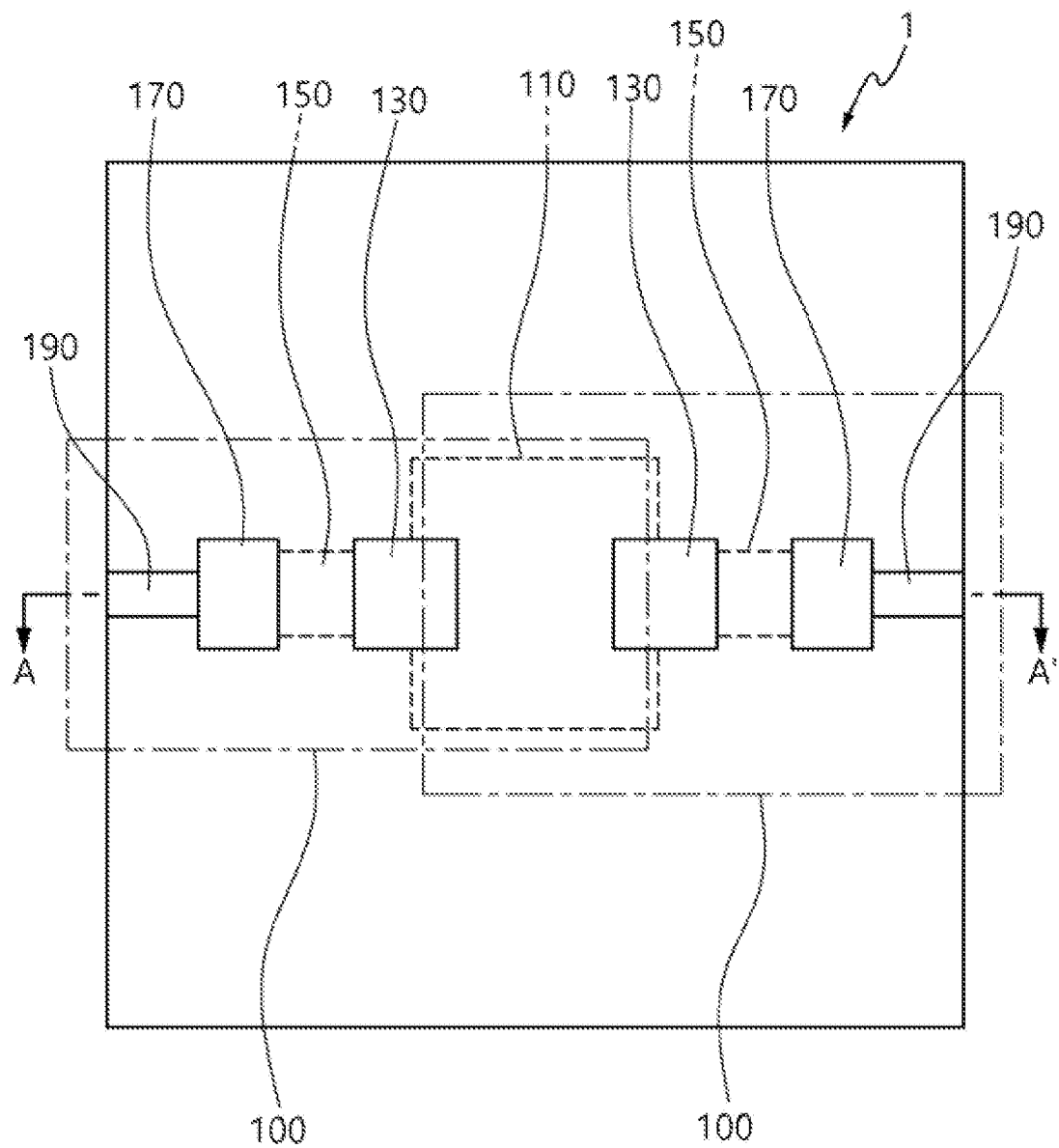
FIG. 2 is a plan view illustrating an indirect ToF pixel according to one or more embodiments of the present disclosure.
Figure 3:
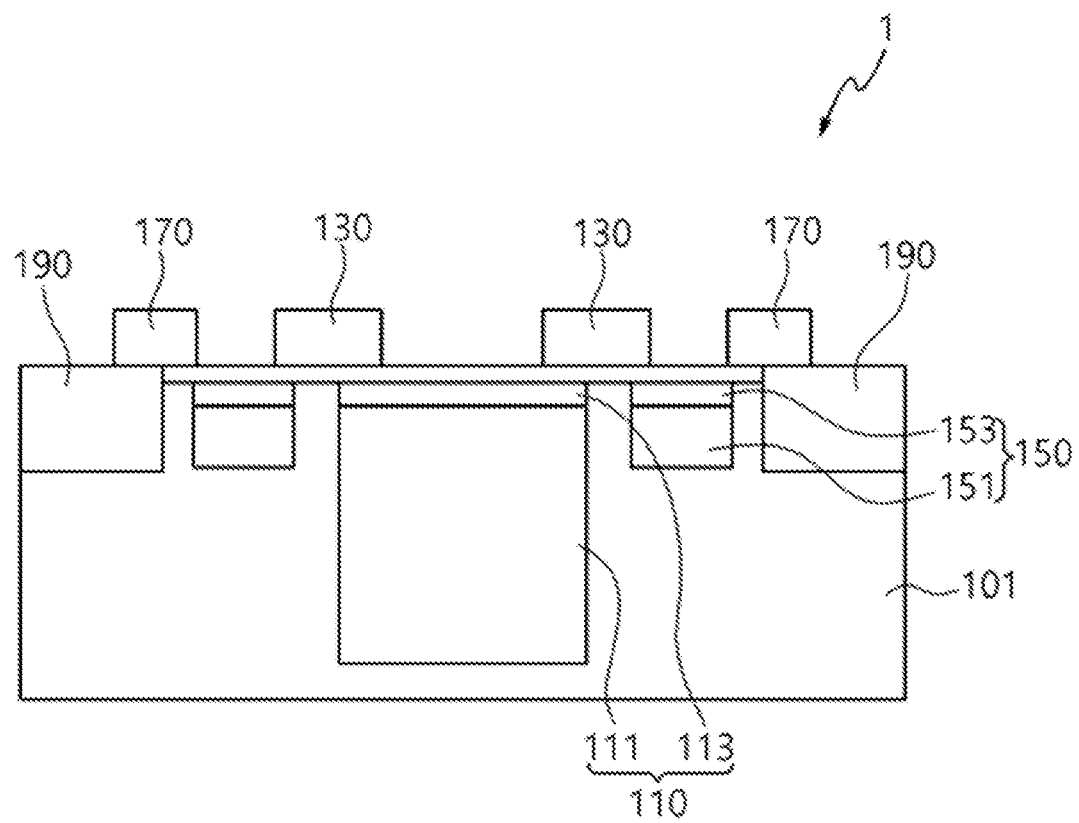
FIG. 3 is a cross-sectional view taken along line A-A' in FIG. 2.

FIG. 2 is a plan view illustrating an indirect ToF pixel according to one or more embodiments of the present disclosure. FIG. 3 is a cross-sectional view taken along line A-A' in FIG. 2.

The indirect ToF pixel structure according to embodiments of the present disclosure will be described in detail with reference to the accompanying drawings.

With reference to FIGS. 2 and 3, the present disclosure relates to an indirect Time-of-Flight (ToF) pixel structure 1. More particularly, the present disclosure relates to a pixel structure including an electric charge storage portion (configured to temporarily store electric charge) between a photoelectric conversion portion and a floating diffusion portion, thereby enabling Correlated Double Sampling (CDS) and removal of noise during readout after integration.

The ToF structure 1 according to embodiments of the present disclosure may be categorized as a 2-tap pixel structure, a 4-tap pixel structure, an 8-tap pixel structure, or so on according to the number of taps in each of which electric charge is processed on a per-phase basis. For example, in the 2-tap pixel structure according to the present disclosure, electric charge differing by 0° and 180° in phase from light or a light source may be transferred to two different electric charge storage portions 150 in the cell. In the 4-tap pixel structure, electric charge differing by 0°, 90°, 180°, and 270° in phase from the light source may be transferred to four respective electric charge storage portions 150 in the cell.

Figure 4:
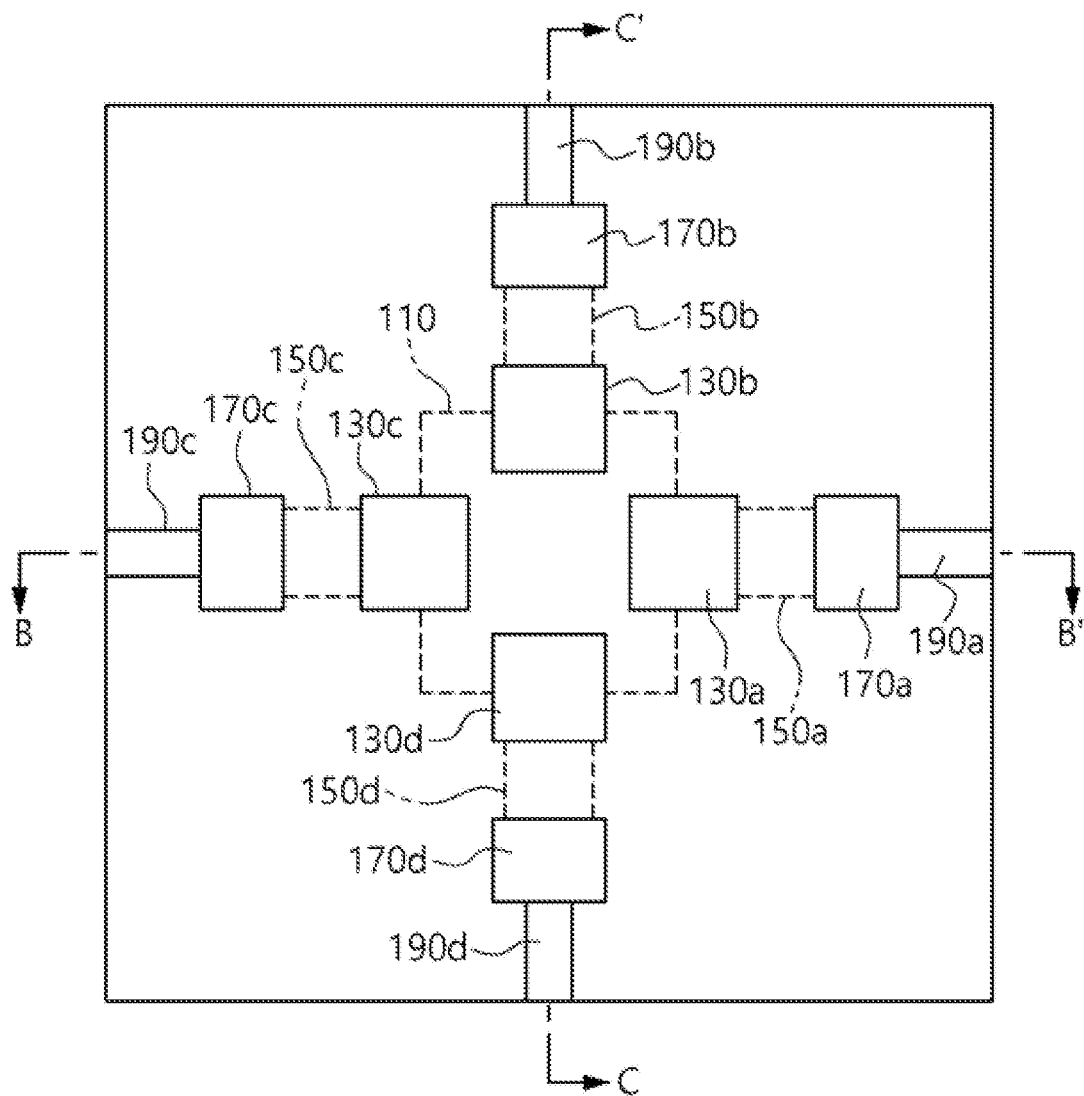
FIG. 4 is a plan view illustrating a ToF pixel structure according to one or more other or further embodiments of the present disclosure.

Referring to FIG. 2, in the 2-tap pixel structure, two rows of first transfer gates 130, electric charge storage portions 150, second transfer gates 170, and floating diffusion portions 190, which will be described below, are symmetrical with respect to the photoelectric conversion portion 110. That is, the rows (each comprising a single transfer gate 130, a single electric charge storage portion 150, a single transfer gate 170, and a single floating diffusion portion 190) may be in two straight and/or linear directions, respectively, with respect to the photoelectric conversion portion 110. In the 4-tap pixel structure (e.g., as shown in FIG. 4), four rows of the first transfer gates 130, the electric charge storage portions 150, the second transfer gates 170, and the floating diffusion portions 190 are around the photoelectric conversion portion 110 in four directions, respectively, with respect to the photoelectric conversion portion 110 at an angle of 90° (e.g., between of each of the four rows).

An individual tap 100 is a structure including a single or individual first transfer gate 130, a single or individual electric charge storage portion 150, a single or individual second transfer gate 170, and a single or individual floating diffusion portion 190.

In addition, the ToF pixel structure 1 according to the present disclosure may employ a one-tap technique or a 2-tap technique, and according to need, may employ a 4-tap technique or an 8-tap technique. No specific limitation to these tap techniques is imposed.

First, referring now to FIG. 3, an epitaxial layer (e.g., of silicon or other semiconducting material) having the first conductivity type may be epitaxially grown on a substrate 101 having a first conductivity type. The epitaxial layer should be conceptually understood as being included in the substrate 101. That is, the substrate 101 includes a substrate having the first conductivity type and the epitaxial layer grown thereon. The photoelectric conversion portion 110 is formed in the substrate 101 (e.g., by photolithographic masking and ion implantation) and may have the first conductivity type.

The photoelectric conversion portion 110 is configured to generate electric charge using light that is incident thereon. In a ToF cell, the incident light is typically that reflected from an object the distance of which is being measured. In addition, it is desirable that the photoelectric conversion portion 110 have a depth into the substrate 101 greater than that of the electric charge storage element 150 described below. In addition, one photoelectric conversion portion 110 is shared by the tap(s) 100. The tap(s) 100 may be symmetrical with respect to the photoelectric conversion portion 110.

It is desirable that the photoelectric conversion portion 110 may be, for example, a photodiode (PD) or a pinned photodiode. The pinned photodiode may be manufactured by performing, for example, ion implantations on the substrate 101, and thus forming a first diffusion region 111 having a second conductivity type and a second diffusion region 113 having the first conductivity type in the substrate 101. The first diffusion region 111 is on the second diffusion region 113. The first diffusion region 111 is a low-density doping region, and the second diffusion region 113 is a region that has a higher dopant density than the epitaxial layer on the substrate 101.

According to a direction (e.g., of signal flow) in the individual taps 100, the first transfer gate 130 is on the substrate 101. The first transfer gate 130 serves to transfer electric charge generated in the photoelectric conversion portion 110 to the electric charge storage portion 150. One first transfer gate 130 is in each individual tap 100 and is, in each tap 100, between the photoelectric conversion portion 110 and the electric charge storage portion 150.

The electric charge storage portion 150 is configured to temporarily store the electric charge transferred from the photoelectric conversion portion 110. One electric charge storage portion 150 may be in each individual tap 100. The electric charge storage portion 150 may include a high-density or low-density doping region having the second conductivity type. No specific limitation to the doping density is imposed. The electric charge storage portion 150 may be a storage diode. As an example, the storage diode may also be a pinned photodiode. The scope of the present disclosure is not limited to the pinned photodiode. When the electric charge storage portion 150 is configured as a pinned photodiode, the electric charge storage portion 150 may include a third diffusion region 151 having the second conductivity type and a fourth diffusion region 153 having the first conductivity type.

The fourth diffusion region 153 is formed on the third diffusion region 151 (e.g., by ion implantation). The fourth diffusion region 153 and the third diffusion region 151 correspond to the first diffusion region 111 and the second diffusion region 113, respectively. Therefore, detailed descriptions of the fourth diffusion region 153 and the third diffusion region 151 are omitted. In addition, it is desirable that the third diffusion region 151 contains a higher density of impurities than the first diffusion region 111, such that the pinning voltage of the third diffusion region 151 is higher than the pinning voltage of the first diffusion region 111. Therefore, movement of the electric charge from the photoelectric conversion portion 110 to the electric charge storage portion 150 can be facilitated.

The first transfer gate 130 may be between the photoelectric conversion portion 110 and the electric charge storage portion 150. That is, the photoelectric conversion portion 110, the first transfer gate 130, and the electric charge storage portion 150 may be sequentially arranged. It is desirable that the electric charge storage portion 150 is spaced apart from the photoelectric conversion portion 110 in the substrate 101. That is, the electric charge storage portion 150 may be surrounded with the first conductivity-type doping region.

Usually, in the ToF pixel structure 9 in the related art, light with a specific wavelength is emitted to an object, the light reflected from the object generates an electric charge in the photoelectric conversion portion 910, and the transfer gate 930 transfers the electric charge from the photoelectric conversion portion 910 to the floating diffusion portion 950. Then, after the integration time (e.g., the time during which the photoelectric conversion portion 910 collects light and generates electrical charges), an amount of electric charge in the floating diffusion portion 950 is converted into a positive voltage, and the positive voltage is read out as a signal. However, a time interval occurs between the times at which the first and last signal electrons, respectively, are transferred to the floating diffusion portion 950. Thus, Corrected Double Sampling (CDS), with which noise is removed in the floating diffusion portion 950, is impossible to perform.

In order to prevent this problem, in the pixel structure 1 according to embodiments of the present disclosure, the separate electric charge storage portion 150 between the photoelectric conversion portion 110 and the floating diffusion portion 190 temporarily stores the electrical charges. Therefore, readout noise may be reduced or minimized. That is, in the Correlated Double Sampling (CDS), while integration is in progress, electric charge is stored in the electric charge storage portion 150 without being transferred to the floating diffusion portion 190. Thereafter, when integration is complete, the floating diffusion portion 190 is reset, and then the voltage of the floating diffusion portion 190 is read out. Thereafter, the electric charge stored in the electric charge storage portion 150 is transferred to the floating diffusion portion 190, and the voltage of the floating diffusion portion 190 is read out again. This Correlated Double Sampling (CDS) can therefore remove noise due to the floating diffusion portion 190.

Figure 5:
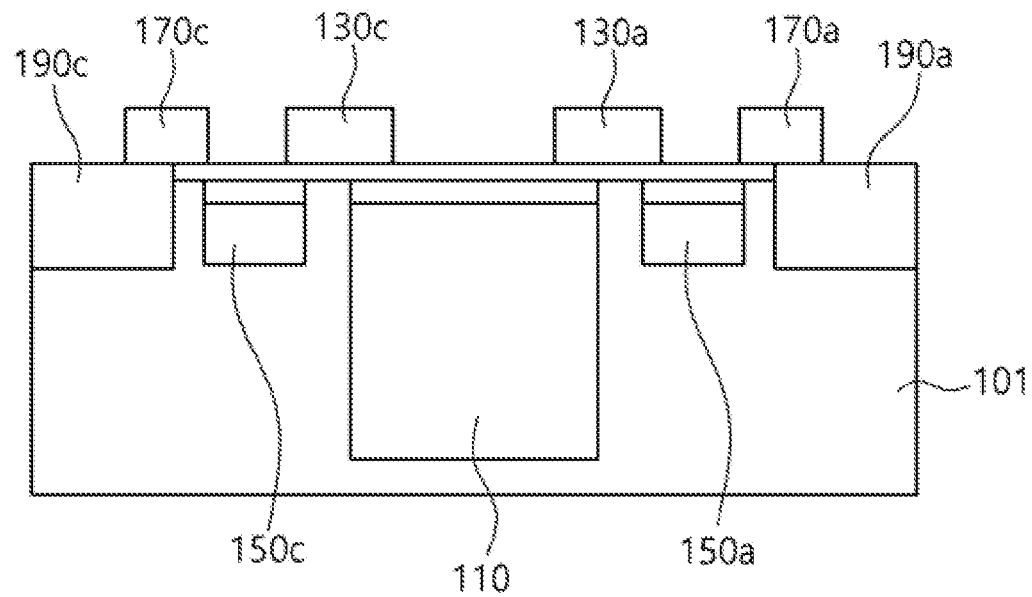
FIG. 5 is a cross-sectional view taken along line B-B' in FIG. 4.
Figure 6:
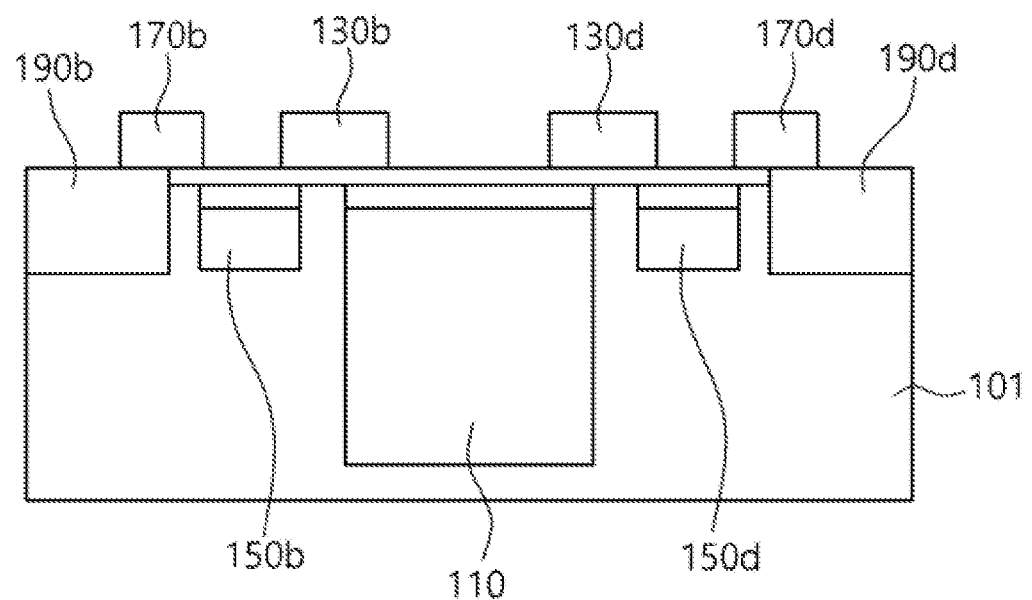
FIG. 6 is a cross-sectional view taken along line C-C' in FIG. 4.

FIG. 4 is a plan view illustrating a ToF pixel structure according to another embodiment of the present disclosure. FIG. 5 is a cross-sectional view taken along line B-B' in FIG. 4. FIG. 6 is a cross-sectional view taken along line C-C' in FIG. 4.

The ToF pixel structure 1 employing the 4-tap technique according to one or more embodiments of the present disclosure will be described below. With reference to FIGS. 4 to 6, one photoelectric conversion portion 110 is in the center portion of the substrate 101. Individual taps 100a, 100b, 100c, and 100d share the photoelectric conversion portion 110.

The individual taps 110a, 110b, 110c, and 110d are around the photoelectric conversion portion 110 in four orthogonal straight and/or linear directions with respect to the photoelectric conversion portion 110. An angle of substantially 90° is between each of the adjacent pairs of individual taps 110a, 110b, 110c, and 110d. For example, when the first tap 100a is in a first direction, the third tap 100c is in a direction opposite to the first tap 100a. In addition, when the second tap 100b is in a second direction, the fourth tap 110d is in a direction opposite to the second tap 100b.

The first transfer gates 130a, 130b, 130c, and 130d in the individual taps 100a, 100b, 100c, and 100d, respectively, are on the substrate 101, adjacent to the photoelectric conversion portion 110. The electric charge storage portions 150a, 150b, 150c, and 150d are in the substrate 101 and adjacent to the first transfer gates 130a, 130b, 130c, and 130d. Second transfer gates 170a, 170b, 170c, and 170d are on the substrate 101 and adjacent to the electric charge storage portions 150a, 150b, 150c, and 150d. In addition, floating diffusion portions 190a, 190b, 190c, and 190d are in the substrate 101 and adjacent to the second transfer gates 170a, 170b, 170c, and 170d, respectively. The first tap 100a may process an electric charge phase-shifted by 0° (e.g., with respect to the emitted light). The second tap 100b may process an electric charge phase-shifted by 90° (e.g., with respect to the emitted light). The third tap 100c may process an electric charge phase-shifted by 180° (e.g., with respect to the emitted light). The fourth tap 100d may process an electric charge phase-shifted by 270° (e.g., with respect to the emitted light).

In the ToF pixel structure 1 employing the 2-tap technique, as illustrated in FIG. 2, the first tap 100a and the second tap 100b are in opposite directions with the photoelectric conversion portion 110 in between. A detailed structure of each of the first tap 100a and the second tap 100b in FIG. 2 is the same as the taps 100a-d in the 4-tap device in FIG. 4.

The present disclosure is described in detail above for illustrative purposes. In addition, the above description is provided for various embodiments of the present disclosure, and various different combinations of, and various modifications to, the disclosed embodiments may be made under various environments. Modifications or alterations to embodiments of the present disclosure are possible within the scope of the concept of the present disclosure, the scope of equivalents of the disclosed contents, and/or the scope of the technology or knowledge in the art. The disclosed embodiments serve to describe various states for realization of the technical ideas of the present disclosure. It is possible that various modifications are made to the disclosed embodiments for the field in which the present disclosure finds application and for making or using the present disclosure. Therefore, in the detailed description of the present disclosure, the embodiments as disclosed are not intended to impose any limitation to the present disclosure.

The invention claimed is:

1. An indirect ToF cell structure comprising:
    at least one tap comprising:
        a photoelectric conversion portion in a substrate, the photoelectric conversion portion being configured to generate electric charge from incident light,
        an electric charge storage portion in the substrate configured to store the electric charge from the photoelectric conversion portion;
        a first transfer gate on the substrate, the first transfer gate being between the photoelectric conversion portion and the electric charge storage portion,
        a floating diffusion portion in the substrate, the floating diffusion portion being configured to receive the electric charge from the electric charge storage portion; and
        a second transfer gate on the substrate, between the electric charge storage portion and the floating diffusion portion,
    wherein the photoelectric conversion portion comprises:
        a first diffusion region having a second conductivity type in the substrate; and
        a second diffusion region having a first conductivity type on the first diffusion region.

2. The indirect ToF cell structure of claim 1, wherein the photoelectric conversion portion, the first transfer gate, the electric charge storage portion, and the floating diffusion portion are sequentially along a substantially straight or linear direction.

3. The indirect ToF cell structure of claim 1, comprising at least two taps, and the at least two taps share the photoelectric conversion portion.

4. The indirect ToF cell structure of claim 3, wherein the at least two taps are symmetrical with respect to the photoelectric conversion portion.

5. An indirect ToF cell structure comprising:
    a photoelectric conversion portion in a substrate, the photoelectric conversion portion being configured to generate electric charge from incident light;
    an electric charge storage portion in the substrate configured to store the electric charge from the photoelectric conversion portion;
    a first transfer gate on the substrate, the first transfer gate being between the photoelectric conversion portion and the electric charge storage portion;
    a floating diffusion portion in the substrate, the floating diffusion portion being configured to receive the electric charge from the electric charge storage portion; and
    a second transfer gate on the substrate, between the electric charge storage portion and the floating diffusion portion,
    wherein the photoelectric conversion portion comprises:
        a first diffusion region having a second conductivity type in the substrate; and
        a second diffusion region having a first conductivity type on the first diffusion region.

6. The indirect ToF cell structure of claim 5, wherein the electric charge storage portion comprises:
    a third diffusion region having the second conductivity type in the substrate; and
    a fourth diffusion region having the first conductivity type on the third diffusion region.

7. The indirect ToF cell structure of claim 6, wherein the second diffusion region contains a higher density of dopant than a first portion of the substrate under the second diffusion region, and
    the fourth diffusion region contains a higher density of a same or different dopant than a second portion of the substrate under the fourth diffusion region.

8. The indirect ToF cell structure of claim 7, wherein the electric charge storage portion has a pinning voltage higher than that of the photoelectric conversion portion.

9. The indirect ToF cell structure of claim 7, wherein the third diffusion region contains a higher density of impurities than the first diffusion region.

10. The indirect ToF cell structure of claim 5, wherein the electric charge storage portion receives the electric charge from the photoelectric conversion portion and stores the electric charge during integration, and
    the floating diffusion portion receives the electric charge from the electric charge storage portion after the integration.

11. The indirect ToF cell structure of claim 10, configured to reset the floating diffusion portion and then transfer the electric charge from the electric charge storage portion to the floating diffusion portion after the integration.

12. An indirect ToF cell structure comprising:
    a photoelectric conversion portion in a substrate;
    a plurality of first transfer gates on the substrate;
    a plurality of electric charge storage portions in the substrate, wherein each of the plurality of first transfer gates is between the photoelectric conversion portion and a corresponding one of the electric charge storage portions, and each of the electric charge storage portions has (i) a first side adjacent to a corresponding one of the plurality of first transfer gates and (ii) a second side;
    a plurality of second transfer gates on the substrate, wherein each of the plurality of second transfer gates is adjacent to the second side of a corresponding one of the plurality of electric charge storage portions; and a plurality of the floating diffusion portions in the substrate, wherein each of the second transfer gates is between the corresponding one of the plurality of electric charge storage portions and a corresponding one of the floating diffusion portions, wherein the first transfer gates, the electric charge storage portions, the second transfer gates, and the floating diffusion portions are in rows that are symmetrical with respect to the photoelectric conversion portion.

13. A 2-tap pixel structure, comprising the indirect ToF cell structure of claim 12.

14. A 4-tap pixel structure, comprising the indirect ToF cell structure of claim 12.

* * * * *